(12) United States Patent
Tuma

(10) Patent No.: US 10,283,170 B2
(45) Date of Patent: May 7, 2019

(54) FAILURE SAFE POWER SOURCE FOR SOLID STATE DISK DRIVES

(71) Applicant: Wade Bert Tuma, Reno, NV (US)

(72) Inventor: Wade Bert Tuma, Reno, NV (US)

( * ) Notice: Subject to any disclaimer, the term of this patent is extended or adjusted under 35 U.S.C. 154(b) by 0 days.

(21) Appl. No.: 15/005,800

(22) Filed: Jan. 25, 2016

(65) Prior Publication Data

US 2017/0020019 A1 Jan. 19, 2017

Related U.S. Application Data

(60) Provisional application No. 62/107,762, filed on Jan. 26, 2015.

(51) Int. Cl.
*G06F 1/18* (2006.01)
*G11C 5/04* (2006.01)

(52) U.S. Cl.
CPC .................. *G11C 5/04* (2013.01); *G06F 1/18* (2013.01); *H05K 2201/10159* (2013.01)

(58) Field of Classification Search
CPC ..................................... G11C 5/04; G06F 1/18
See application file for complete search history.

(56) References Cited

U.S. PATENT DOCUMENTS

| 4,840,570 | A | * | 6/1989 | Mann, Jr. | ........... H01R 12/7005 361/787 |
| 5,528,460 | A | * | 6/1996 | Byrd | ...................... H05K 3/301 307/150 |
| 7,397,671 | B2 | * | 7/2008 | Cleveland | ............... G06F 1/184 361/679.55 |
| 8,514,565 | B2 | * | 8/2013 | Foo | ........................ G06F 1/1635 361/679.32 |
| 9,603,280 | B2 | * | 3/2017 | Frank | .................... H05K 7/1489 |
| 2001/0044281 | A1 | * | 11/2001 | Peterzell | ............. H04M 1/0262 455/575.1 |
| 2002/0059492 | A1 | * | 5/2002 | Sabotta | ............... G06F 13/4022 710/301 |
| 2002/0080541 | A1 | * | 6/2002 | Bunker | ................... G06F 1/184 361/72 |
| 2009/0231798 | A1 | * | 9/2009 | Skinner | ................... G06F 1/185 361/679.31 |
| 2010/0136411 | A1 | * | 6/2010 | Yoon | ....................... H01M 4/13 429/144 |
| 2010/0142243 | A1 | * | 6/2010 | Baxter | ..................... G11C 5/04 365/51 |
| 2010/0232124 | A1 | * | 9/2010 | Bang | ........................ H05K 1/18 361/752 |
| 2010/0259882 | A1 | * | 10/2010 | Song | .................... H01L 23/5384 361/679.32 |

(Continued)

*Primary Examiner* — David M Sinclair
*Assistant Examiner* — Theron S Milliser
(74) *Attorney, Agent, or Firm* — Palo Alto Legal Group, P.C.; Omair M. Farooqui, Esq.; Aziz M. Ahsan, Esq.

(57) ABSTRACT

An aspect of the present invention includes a module comprising a printed circuit board and a SSD case with at least one structural component that is removably coupled to the printed circuit board, whereby the at least one structural component is a power source. An aspect of the present invention includes a method of providing power to a module, comprising the steps of providing a printed circuit board and removably connecting a SSD case with at least one structural component to the printed circuit board, whereby the at least one structural component is a power source.

20 Claims, 8 Drawing Sheets

(56) References Cited

U.S. PATENT DOCUMENTS

| | | | |
|---|---|---|---|
| 2011/0085312 A1* | 4/2011 | Tang | G06F 1/1658 361/784 |
| 2013/0083257 A1* | 4/2013 | Murakami | G06F 1/18 348/839 |
| 2013/0128464 A1* | 5/2013 | Chen | H05K 7/026 361/721 |
| 2013/0149602 A1* | 6/2013 | Luski | H01M 4/0459 429/188 |
| 2013/0155800 A1* | 6/2013 | Shim | G11C 5/04 365/229 |
| 2014/0272475 A1* | 9/2014 | Morash | B22D 31/00 429/6 |
| 2014/0340834 A1* | 11/2014 | Lee | G06F 1/185 361/679.32 |

\* cited by examiner

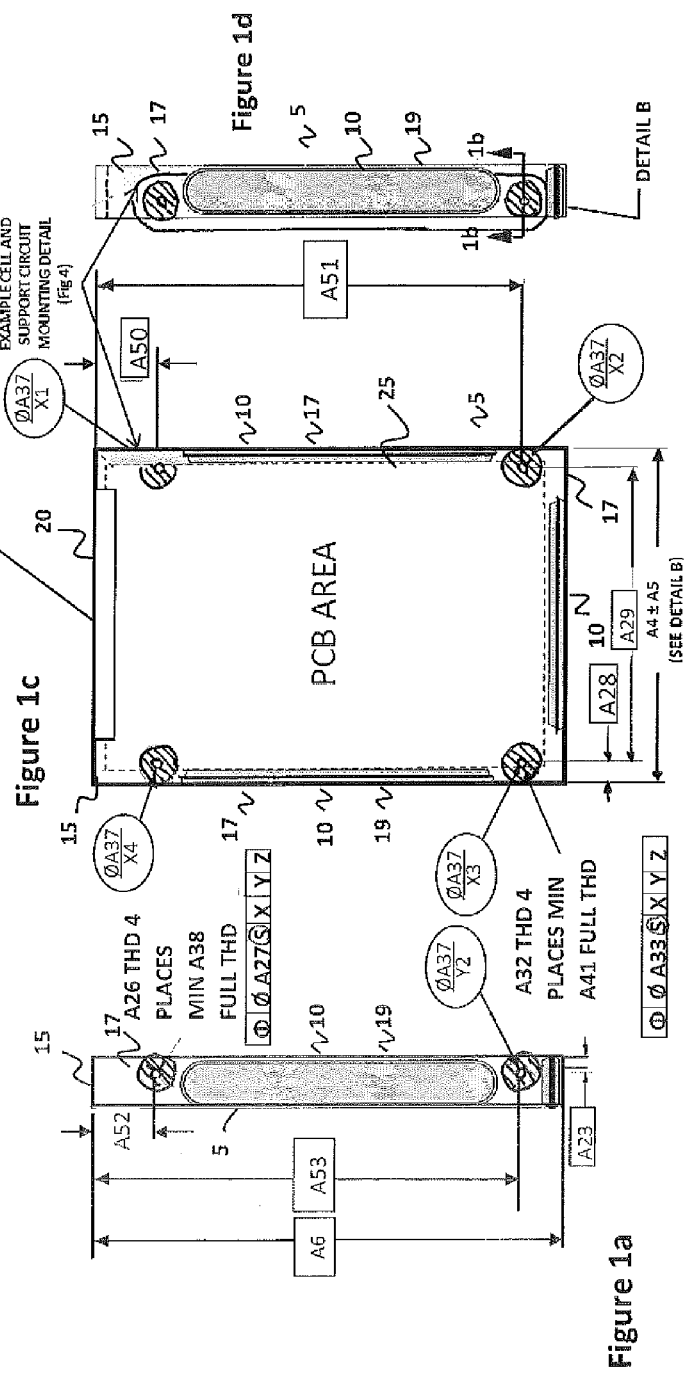

2.5" SSD Cell Mounting Locations

Sealed Cell & Support Circuit Mounting Detail

SSD Wall mounted Sealed Cell and Support Circuits

SSD Wall mounted Sealed Cell Without Support Circuits

DISK DRIVE DIMENSIONS

| Dimension | | Millimeters | Inches | Comments |
|---|---|---|---|---|
| A 1 | | 19.05 | 0.750 | |
| A 1 | | 17.00 | 0.669 | |
| A 1 | | 15.00 | 0.591 | |
| A 1 | | 12.70 | 0.500 | |
| A 1 | | 10.50 | 0.413 | |
| A 1 | | 9.50 | 0.374 | A2=A3=0.20 mm |
| A 1 | | 8.47 | 0.333 | |
| A 1 | | 7.00 | 0.276 | A2=0.20 mm |
| A 1 | | 5.00 | 0.197 | A2=A3=0.20 mm |
| A 2 | | 0.00 | 0.000 | |
| A 3 | | 0.50 | 0.020 | |
| A 4 | | 69.85 | 2.750 | |
| A 5 | | 0.25 | 0.010 | |
| A 6 | Max | 101.85 | 4.010 | Obsolete |
| A 6 | Max | 100.45 | 3.955 | New requirement |
| A10 | | 100.20 | 3.945 | SFF-8212 |
| A11 | | 100.50 | 3.957 | SFF-8223 |
| A12 | | 110.20 | 4.339 | SFF-8222 |
| A23 | | 3.00 | 0.118 | |
| A24 | | 34.93 | 1.375 | Obsolete |
| A25 | | 38.10 | 1.500 | Obsolete |
| A26 | | M3 | N/A | |
| A27 | | 0.50 | 0.020 | |
| A28 | | 4.07 | 0.160 | |
| A29 | | 61.72 | 2.430 | |
| A30 | | 34.93 | 1.375 | Obsolete |
| A31 | | 38.10 | 1.500 | Obsolete |
| A33 | | 0.50 | 0.020 | |
| A37 | | 8.00 | 0.315 | |
| A50 | | 14.00 | 0.551 | |
| A51 | | 90.60 | 3.567 | |
| A52 | | 14.00 | 0.551 | |
| A53 | | 90.60 | 3.567 | |
| Threads | | | | |
| A32 | | Size | M3 | |
| A38 | Min | Penetration | 3 | 2 for A1 ≤ 7 mm |
| A41 | Min | Penetration | 2.5 | |

Figure 5

FAILURE SAFE POWER SOURCE FOR SOLID STATE DISK DRIVES

CROSS-REFERENCE TO RELATED APPLICATION

The instant application claims priority to and benefit of pending U.S. Provisional Patent Application Ser. No. 62/107,762, filed on Jan. 26, 2015, titled, "Failure Safe Power Source for Solid State Disk Drives," the entire disclosure of which provisional application is incorporated herein by reference.

FIELD OF THE INVENTION

The present invention relates generally to the field of solid-state drives or solid-state disk or electronic disk (SSD). The present invention also relates to methods and apparatuses for using a power source as a structural component of the SSD. The present invention can be applied to any industry that uses SSDs. Aspects of the present invention can be applied to flash memory SSDs, including semiconductor based and non-rotating disk drives.

BACKGROUND OF THE INVENTION

A SSD is a data storage device using integrated circuit assemblies as memory to store data persistently. SSD technology uses electronic, interfaces compatible with traditional block input/output (I/O) hard disk drives, thus permitting simple replacement in common applications.

SSDs have no moving (mechanical) components. This distinguishes them from traditional electromechanical magnetic disks such as hard disk drives (HDDs) or floppy disks, which contain spinning disks and movable read/write heads. Compared with electromechanical disks, SSDs are typically more resistant to physical shock, run silently, have lower or faster access time, and less latency. However, while the price of SSDs has continued to decline over time, SSDs are still roughly seven to eight times more expensive per unit of storage than HDDs.

Recently, most SSDs use NAND (Not And electronic logic gate)-based flash memory, which retains data without power. For applications requiring fast access, but not necessarily data persistence after power loss, SSDs may be constructed from random-access memory (RAM). Such devices may employ separate power sources, such as batteries, to maintain data after power loss.

Key components of a SSD are the controller and the memory to store the data. The primary memory component in a SSD was traditionally dynamic random-access memory DRAM volatile memory, now more commonly NAND flash non-volatile memory. Other components play a less significant role in the operation of the SSD and vary among manufacturers.

Every SSD includes a controller that incorporates the electronics that bridge the NAND memory components to the host computer. The controller is an embedded processor that executes firmware-level code and is one of the most important factors of SSD performance. Some of the functions performed by the controller include: error-correcting code (ECC), wear leveling, bad block mapping, read scrubbing and read disturb management, read and write caching, garbage collection, and encryption.

Most SSD manufacturers use non-volatile NAND flash memory in the construction of their SSDs because of the lower cost compared with DRAM and the ability to retain the data without a constant power supply, ensuring data persistence through sudden power outages. Flash memory SSDs are slower than DRAM solutions, and some early designs were even slower than HDDs after continued use. This problem was resolved by controllers that came out later. Flash memory-based solutions are typically packaged in standard disk drive form factors (1.8-, 2.5-, and 3.5-inch), or smaller unique and compact layouts because of the compact memory.

Another component in higher performing SSDs is a capacitor or some form of battery. These are necessary to maintain data integrity such that the data in the cache can be flushed to the drive when power is dropped; some may even hold power long enough to maintain data in the cache until power is resumed. In the case of MLC (multi level cell) flash memory, a problem called lower page corruption can occur when MLC flash memory loses power while programming an upper page. The result is that data written previously and presumed safe can be corrupted if the memory is not supported by a super capacitor in the event of a sudden power loss. This problem does not exist with SLC flash memory.

The size and shape of any device is largely driven by the size and shape of the components used to make that device. If an SSD is made up of various interconnected integrated circuits (ICs) and an interface connector, then its shape could be virtually anything imaginable because it is no longer limited to the shape of rotating media drives. Some solid state storage solutions come in a larger chassis that may even be a rack-mount form factor with numerous SSDs inside. They would all connect to a common bus inside the chassis and connect outside the box with a single connector.

For general computer use, the 2.5-inch form factor (typically found in laptops) is the most popular. For desktop computers with 3.5-inch hard disk slots, a simple adapter plate can be used to make such a disk fit. Other types of form factors are more common in enterprise applications. An SSD can also be completely integrated in the other circuitry of the device, as in certain Apple devices. Further, mSATA and M.2 form factors are also gaining popularity, primarily in laptops.

PURPOSES AND SUMMARY OF THE INVENTION

An aspect of the present invention includes a module comprising a printed circuit board and a SSD case with at least one structural component that is removably coupled to the printed circuit board, whereby the at least one structural component is a power source.

An aspect of the present invention includes a method of providing power to a module, comprising the steps of providing a printed circuit board and removably connecting a SSD case with at least one structural component to the printed circuit board, whereby the at least one structural component is a power source.

BRIEF DESCRIPTION OF THE DRAWINGS

Although the scope of the present invention is much broader than any particular embodiment, a detailed description of the preferred embodiment follows together with drawings. These drawings are for illustration purposes only and are not drawn to scale. Like numbers represent like features and components in the drawings. The invention may best be understood by reference to the ensuing detailed description in conjunction with the drawings in which:

FIG. 1a illustrates a diagram of an exemplary aspect of the present invention depicting an exemplary SSD module of the present invention.

FIG. 1b illustrates a diagram of an exemplary aspect of the present invention depicting SSD module of the present invention.

FIG. 1c illustrates a diagram of an exemplary aspect of the present invention depicting an exemplary SSD module of the present invention.

FIG. 1d illustrates a diagram of an exemplary aspect of the present invention depicting an exemplary SSD module of the present invention.

FIG. 5 illustrates a table of an exemplary embodiment of the present invention depicting disk drive dimensions.

DETAILED DESCRIPTION OF THE INVENTION

Figures 2A, 2B, 2C, 2D:
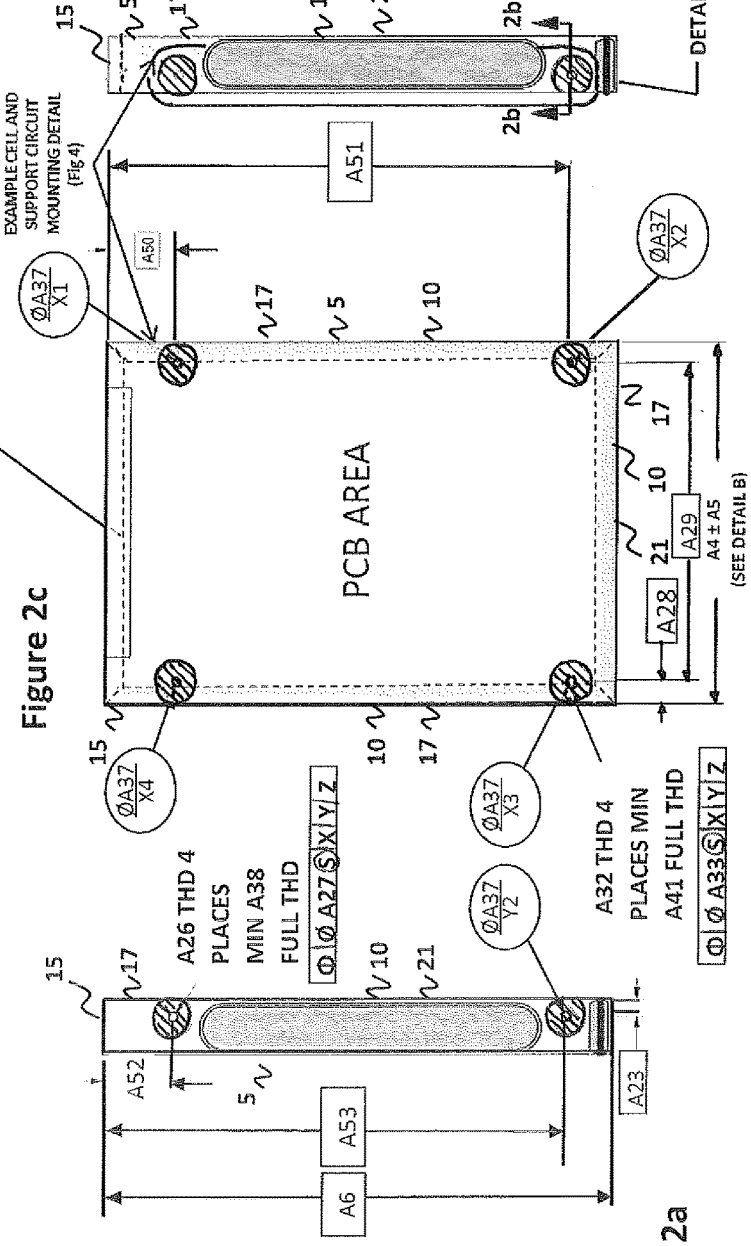
FIG. 2a illustrates a diagram of an exemplary aspect of the present invention depicting an exemplary SSD module of the present invention.
FIG. 2b illustrates a diagram of an exemplary aspect of the present invention depicting SSD module of the present invention.
FIG. 2c illustrates a diagram of an exemplary aspect of the present invention depicting an exemplary SSD module of the present invention.
FIG. 2d illustrates a diagram of an exemplary aspect of the present invention depicting an exemplary SSD module of the present invention.

The following is a detailed description of the exemplary embodiments of the present methods and apparatuses for using a power source as a structural component of the SSD. However, the present invention is in no way intended to be limited to the embodiments discussed below or shown in the drawings. Rather, the description and drawings are merely illustrative of the exemplary and presently preferred embodiments of the invention.

General trends in the flash SSD market are greater capacity and greater performance in thinner and smaller packages. For example, recent products contain multiple terabytes of memory in packages which measure length 100.45 mm×width 69.85 mm×height 7 mm. These exemplary drives contain the necessary flash memory chips, power management systems, and host interface chips (SATA (serial ATA (AT attachment)), SAS (serial attached SCSI (small computer system interface)), or PCIe (peripheral component interconnect express)). In one example, because of the intrinsic characteristics of flash, not all memory locations are good and additional memory locations will go bad after the drive is in use. Thus flash designs use constantly changing, mapping tables that correlate the actual location of the data stored in flash memory to the block requested by the host.

These mapping tables must be stored if the power fails so that the locations of the stored data can again be correlated to the blocks requested by the host computer when power is restored. As the drives get larger and larger the tables grow in size as well. For example, present drives use very large capacitors or "super caps" to hold up the various internal drive voltages so these tables and other critical data can be stored in the flash memory, after power to the drive fails. These capacitors take up space that could otherwise be used for additional memory and add substantial cost to the drive.

Furthermore, there are several disadvantages to super caps, such as (i) linear discharge voltage prevents use of the full energy spectrum; (ii) low energy density—typically holds one-fifth to one-tenth the energy of an electrochemical battery; (iii) cells have low voltages—serial connections are needed to obtain higher voltages. Voltage balancing is required if more than three capacitors are connected in series; (iv) high self-discharge—the rate is considerably higher than that of an electrochemical battery; and (v) requires sophisticated electronic control and switching equipment.

Another alternative is lithium based cells which have substantial capacity but also require substantial board space. Both lithium cells and super caps, degrade due to high temperatures so the cooler they can be kept, the longer their functional life. Placing these components on the pc board makes field replacement unacceptably difficult and so failure of these components requires replacement of the drive.

Aspects of an exemplary embodiment of the present invention includes using the exemplary hold-up power source as a removable structural component of the SSD case instead of or opposed to, for example, PCB (printed circuit board) mounting of the power source. In an exemplary embodiment, a wall of the case would be replaced with a hold-up power source. In an exemplary embodiment, the power source would be removably packaged to serve both its electrical function of providing additional power to the circuitry whenever power to the drive fails, while simultaneously serving as a structural component of the solid state disk case. In an exemplary embodiment, by integrating the hold-up power source into the case design the power source can be easily field replaced without dismantling the drive and also can be better cooled as it can provide an external surface for cooling airflow as well as being insulated from high internal drive temperatures. An aspect of an exemplary embodiment of the present invention is that, charging, discharging and safety components can also be contained in the wall of the case so that these components can also be removed from the PCB. In one exemplary embodiment charging components for example, are small integrated circuits that control the charging rate of the lithium cells, necessary to prevent over charging. Thermal devices such as thermistors, which monitor the temperature of the cell to limit charging if the cell temperature is too high, current limiting devices or switches (typically FET switches) to prevent rapid discharge of the cell due to inadvertent shorts and to meet required safety standards for shipping of case subassemblies which contain cells. In another exemplary embodiment, the removable power source is removably attached to the other structural elements of the SSD disk case. In another exemplary embodiment, the removable power source is removably attached to the PCB. In another exemplary embodiment, the removable power source is not attached to the PCB. Aspects of the present invention may be implemented in various configurations.

Aspects of an exemplary embodiment of the present invention are that the exemplary embodiment supplies longer hold-up time for flash memory SSDs, do not use critical pc board resources, optimize hold-up power source cooling, and allow for easy replacement of hold-up power source.

In one exemplary embodiment, FIG. 1a illustrates a diagram of an exemplary aspect of the present invention depicting an exemplary SSD module 5 of the present invention. In one exemplary embodiment, module 5 is part of a greater computer system or any type of electronic system where, in one exemplary embodiment, the storage of data is necessary. In one exemplary embodiment, module 5 is an exemplary SSD. In one exemplary embodiment, module 5 is in the form of a SSD case 15. In one exemplary embodiment, power source 10 is removably packaged as a structural component 17, such as, for example, a wall of case 15. In one exemplary embodiment, power source 10 is a 2.5" SSD sealed cell 19. However power source 10 may be any form of cell or battery source. In one exemplary embodiment, power source 10 may form the entire structural component, such as a wall of case 15. In one exemplary embodiment, power source 10 may form one or more structural components 17, such as walls of case 15. In one exemplary embodiment, power source 10 connects with the electronic circuitry of the PCB board 25 (shown in FIGS. 1c, 2c).

In one exemplary embodiment, FIG. 1b illustrates a diagram of an exemplary aspect of the present invention depicting SSD module 5 of the present invention. In one exemplary embodiment, module 5 is in the form of a SSD case 15. In one exemplary embodiment, connector end 20 is located at one end of case 15. Connecter end 20 connects SSD module 5 with the greater computer system or any type of electronic system for that matter.

In one exemplary embodiment, FIG. 1c illustrates a diagram of an exemplary aspect of the present invention depicting an exemplary SSD module 5 of the present invention. In one exemplary embodiment, module 5 is in the form of a SSD case 15. The exemplary embodiment shown in FIG. 1c depicts a rectangular case 15, with three structural components 17, such as, for example, three walls 17. However, aspects of the present invention may be expressed in any form of shapes and sizes. For example, in one exemplary embodiment, case 15 may be in the shape of any polygon, such as, for example, a square, pentagon, hexagon, heptagon, octagon, nonagon, decagon, circular, or oval, or for that matter, any shape in which a power source 10 may act as a structural component 17, such as, for example, a wall or side 17, in one exemplary embodiment, power source 10 may removably be the top or bottom of case 15 or any surface of case 15 and may act as a structural component 17 in that regard. In one exemplary embodiment, power source 10 may removably form the entire structural component 17, such as a wall of case 15. In one exemplary embodiment, power source 10 may removably form one or more structural components 17, such as walls of case 15. In one exemplary embodiment, power source 10 when engaged connects with the electronic circuitry of the PCB board 25. In one exemplary embodiment, power source 10 is a 2.5" SSD sealed cell 19.

In one exemplary embodiment, FIG. 1d illustrates a diagram of an exemplary aspect of the present invention depicting an exemplary SSD module 5 of the present invention. In one exemplary embodiment, module 5 is in the form of a SSD case 15. In one exemplary embodiment, power source 10 is removably packaged as a structural component 17, such as, for example, a wall of case 15. In one exemplary embodiment, power source 10 is a 2.5" SSD sealed cell 19.

In one exemplary embodiment, FIG. 2a illustrates a diagram of an exemplary aspect of the present invention depicting an exemplary SSD module 5 of the present invention. In one exemplary embodiment, module 5 is part of a greater computer system or any type of electronic system where, in one exemplary embodiment, the storage of data is necessary. In one exemplary embodiment, module 5 is in the form of a SSD case 15. In one exemplary embodiment, power source 10 is removably packaged as a structural component 17, such as, for example, a wall of case 15. In one exemplary embodiment, power source 10 is a 2.5" SSD pouch cell 21. However power source 10 may be any form of cell or battery source. In one exemplary embodiment, power source 10 may form the entire structural component, such as a wall of case 15. In one exemplary embodiment, power source 10 may form one or more structural components 17, such as walls of case 15. In one exemplary embodiment, power source 10 connects with the electronic circuitry of the PCB board (shown in FIGS. 1c, 2c).

In one exemplary embodiment, FIG. 2b illustrates a diagram of an exemplary aspect of the present invention depicting SSD module 5 of the present invention. In one exemplary embodiment, module 5 is in the form of a SSD case 15. In one exemplary embodiment, connector end 20 is located at one end of case 15. Connecter end 20 connects SSD module 5 with the greater computer system or any type of electronic system for that matter.

In one exemplary embodiment, FIG. 2c illustrates a diagram of an exemplary aspect of the present invention depicting an exemplary SSD module 5 of the present invention. In one exemplary embodiment, module 5 is in the form of a SSD case 15. The exemplary embodiment shown in FIG. 2c depicts a rectangular case 15, with three structural components 17, such as, for example, three walls 17. However, aspects of the present invention may be expressed in any form of shapes and sizes. For example, in one exemplary embodiment, case 15 may be in the shape of any polygon, circle, or oval, or for that matter, any shape in which a power source 10 may act as a structural component 17, such as, for example, a wall or side 17. In one exemplary embodiment, power source 10 may removably be the top or bottom of case 15 or any surface of case 15 and may act as a structural component 17 in that regard. In one exemplary embodiment, power source 10 may removably form the entire structural component 17, such as a wall of case 15. In one exemplary embodiment, power source 10 may removably form one or more structural components 17, such as walls of case 15. In one exemplary embodiment, power source 10 when engaged connects with the electronic circuitry of the PCB board 25. In one exemplary embodiment, power source 10 is a 2.5" SSD pouch cell 21.

In one exemplary embodiment, FIG. 2d illustrates a diagram of an exemplary aspect of the present invention depicting an exemplary SSD module 5 of the present invention. In one exemplary embodiment, module 5 is in the form of a SSD case 15. In one exemplary embodiment, power source 10 is removably packaged as a structural component 17, such as, for example, a wall of case 15. In one exemplary embodiment, power source 10 is a 2.5" SSD pouch cell 21.

Figure 3A:
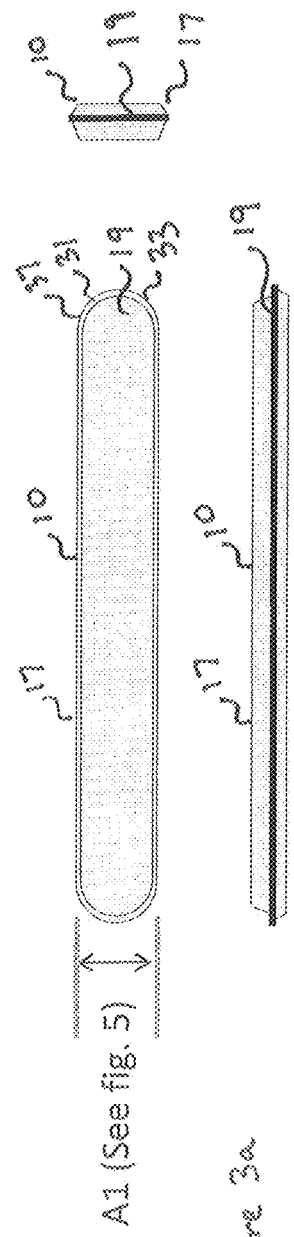
FIG. 3a illustrates a diagram of an exemplary embodiment of the present invention depicting a sealed cell that is removably packaged as a structural component.

In one exemplary embodiment, FIG. 3a illustrates a diagram of an exemplary aspect of the present invention depicting a power source 10 that is, in one exemplary embodiment, a sealed cell 19, that may be removably packaged as a structural component 17, such as, for example, a wall of case 15 (shown in FIGS. 1a, 2a). In one exemplary embodiment, the end portion 31 of power source 10 has at least one connecting means 33 and as locking means 37 to engage with at least one support chip 30 (shown in FIG. 4a). In one exemplary embodiment, the end portion 31 has at least one connecting means 33 and a locking means 37 to engage with at least one PCB interface connectors 35 (not shown). In one exemplary embodiment, connecting means 33 may be located anywhere on power source 10. In one exemplary embodiment, locking means 37 may be located anywhere on power source 10.

Figure 3B:
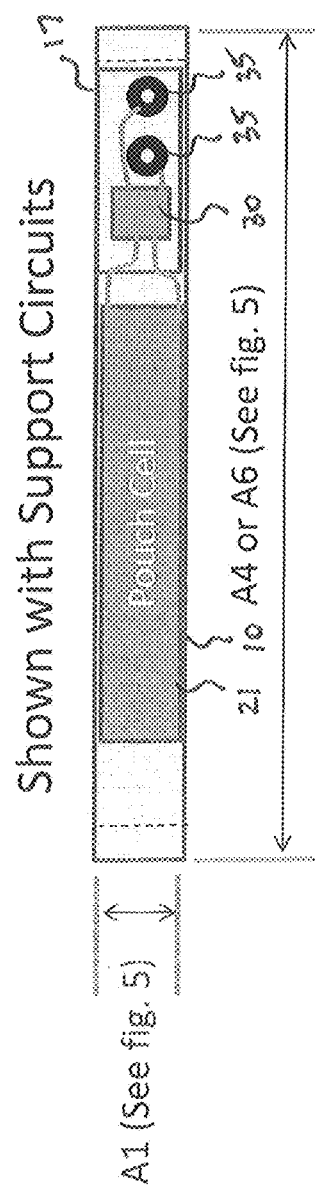
FIG. 3b illustrates a diagram of an exemplary embodiment of the present invention depicting a pouch cell that is removably packaged as a structural component.

In one exemplary embodiment, FIG. 3b illustrates a diagram of an exemplary aspect of the present invention depicting a power source 10 that is a pouch cell 21 that may be removably packaged as a structural component 17, such as, for example, a wall of case 15 (shown in FIGS. 1a, 2a). In one exemplary embodiment, pouch cell 21 is connected to support chip 30. In one exemplary embodiment, pouch cell 21 is connected to PCB interface connectors 35.

Figure 4A:
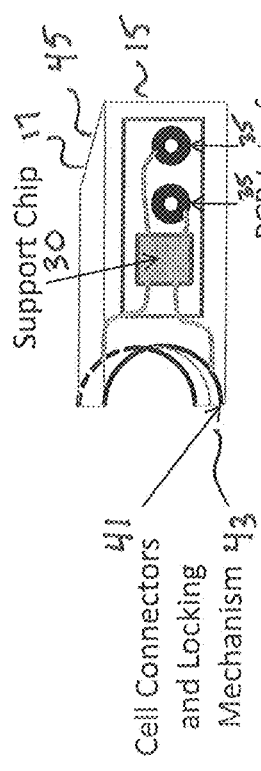
FIG. 4a illustrates a diagram of an exemplary embodiment of the present invention depicting a structural component and support circuits.

In one exemplary embodiment, FIG. 4a illustrates a diagram of an exemplary aspect of the present invention depicting sealed cell and support circuit mounting detail. In one exemplary embodiment, the connecting means 33 (shown in FIG. 3a) and locking means 37 (shown in FIG. 3a) of end portion 31 (shown in FIG. 3a) of power source 10 (shown in FIGS. 1a, 2a), such as, for example, a sealed cell 19 (shown in FIGS. 1a, 3a), engage with at least one connecting means 41 and at least one locking means 43 of mounting member 45 which may be a part of structural component 17, such as, for example, a wall of case 15. In one exemplary embodiment, sealed cell 19 is connected to support chip 30. In one exemplary embodiment, sealed cell 19 (shown in FIGS. 1a, 3a) is connected to PCB interface connectors 35.

Figure 4B:
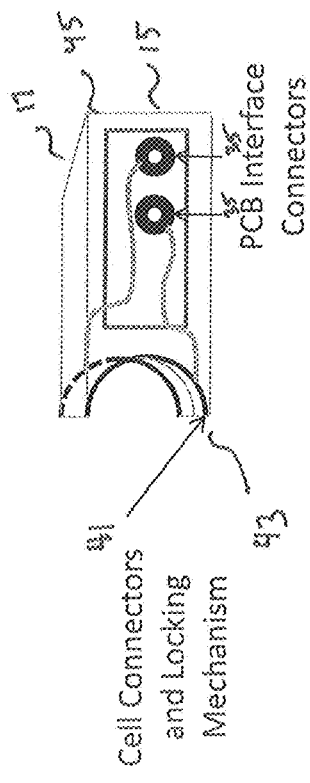
FIG. 4b illustrates a diagram of an exemplary embodiment of the present invention depicting a structural component without support circuits.

In one exemplary embodiment, FIG. 4b illustrates a diagram of an exemplary aspect of the present invention depicting a sealed cell and support circuit mounting detail. In one exemplary embodiment, the connecting means 33 (shown in FIG. 3a) and locking means 37 (shown in FIG. 3a) of end portion 31 (shown in FIG. 3a) of power source 10 (shown in FIGS. 1a, 2a, 3a) engage with at least one connecting means 41 and at least one locking means 43 of mounting member 45 which may be a part of structural component 17, such as a wall of case 15. In one exemplary embodiment, sealed cell 19 (not show connected to PCB interface connectors 35.

In one exemplary embodiment, FIG. 5 illustrates a table of an exemplary embodiment of the present invention depicting disk drive dimensions. In one exemplary embodiment, standard 2.5" drives, vary in height as determined by dimension A1 which varies from about 5 mm to about 19 mm.

Exemplary embodiments of the present invention permit the use of various materials for the at least one structural component 17, and wherein the material for the at least one structural component 17, could be selected from a group comprising steel, plated steel and aluminum and other applicable metals and plastics.

Exemplary embodiments of the present invention permit increased capacity to store in-transit-data and links to address locations of the drive when power fails.

Exemplary embodiments of the present invention may also include charging, monitoring, and safety circuitry integration into the structural hold-up power source package.

Safety Circuits: For example, safety circuits are typically low impedance FET (field-effect transistor) switches which are used in series with the LI battery terminals to prevent inadvertent shorting of the LI battery(s) terminals during transit of the battery assembly to the final manufacturing facility. These may be required by some regulatory agencies. These FET switches can be activated (closed) by additional interface connectors, jumpers or circuitry which only allows the battery terminals to be available when installed in the final configuration.

Monitoring Circuits: As a further example, voltage or voltage/current monitoring is used to ascertain the state of charge of the battery. The battery must contain enough charge to be able to complete the functions described earlier, as an example, when powered down. If the battery requires charge before it can perform its function, the SSD may be kept offline, busy, or write protected to prevent potential changes to the SSD contents until the battery has adequate charge to insure SSD data integrity. Data from the monitoring circuits can be provided to the host computer through normal drive health logs which vary with the disk interface standard and/or by illuminating LEDs for visual monitoring. These LEDs can also be contained in the wall subassembly.

As a further example, temperature monitoring is used to monitor the battery temperature. LI batteries for example, should not be charged when temperatures are above a certain threshold. Often this monitoring is with a thermistor in contact with the battery. Circuitry to monitor the thermistor temperature is often a digital or analog comparator which the resistance of the thermistor is compared to a fixed resistance.

Charging Circuits: As a further example, LI batteries for example use a specific current profile for charging, both to keep the battery from overheating and to maximize battery life. These LI battery chargers are commercially available integrated circuits or could be implemented with discrete components. Often safety and monitoring circuitry may be supplied with the charger as well.

Figure 6:
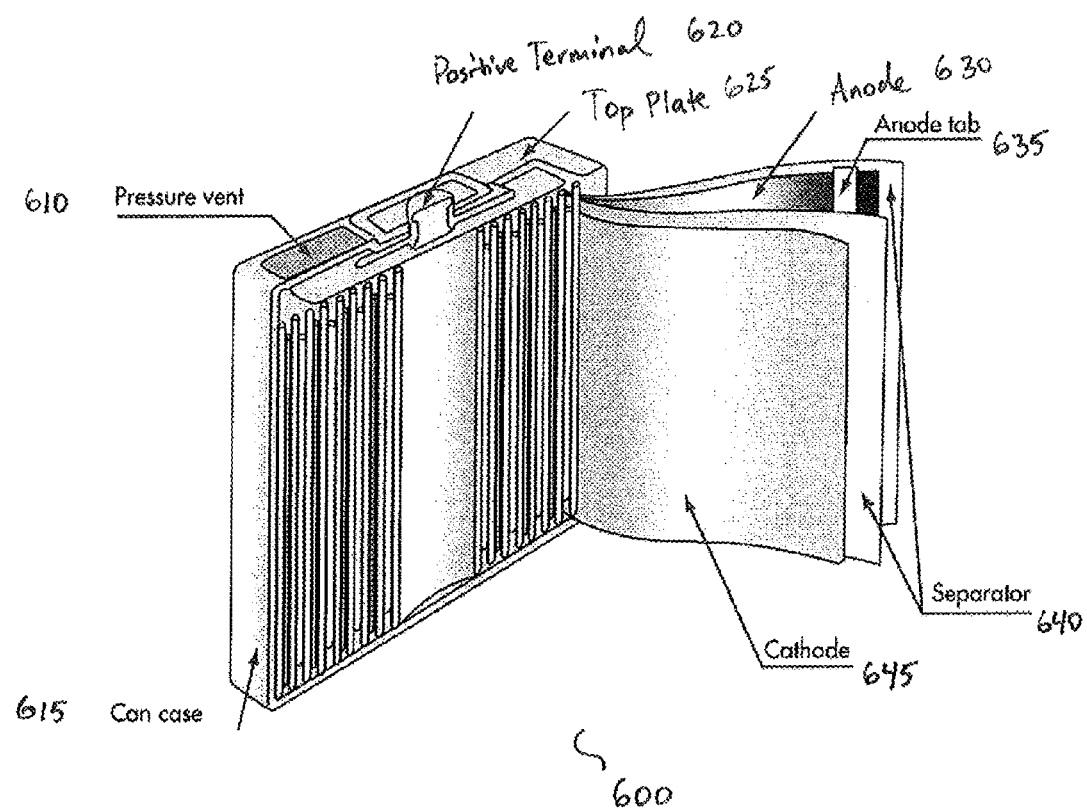
FIG. 6 illustrates a diagram of an exemplary embodiment of the present invention depicting a prismatic or brick-shaped Li-ion cell.

FIG. 6 illustrates a diagram of an exemplary embodiment of the present invention depicting a prismatic or brick-shaped Li-ion cell 600. Typically, prismatic cells are cost effective and come in a large variety of sizes and shapes. In one exemplary embodiment, prismatic cell 600 comprises of a pressure vent 610. In one exemplary embodiment, prismatic cell 600 comprises of a can case 615. In one exemplary embodiment, prismatic cell 600 comprises of a positive terminal 620. in one exemplary embodiment, prismatic cell 600 comprises of a top plate 625. In one exemplary embodiment, prismatic cell 600 comprises of an anode 630. In one exemplary embodiment, prismatic cell 600 comprises of an anode tab 635. In one exemplary embodiment, prismatic cell 600 comprises of a separator 640. In one exemplary embodiment, prismatic cell 600 comprises of a cathode 645.

Figure 7:
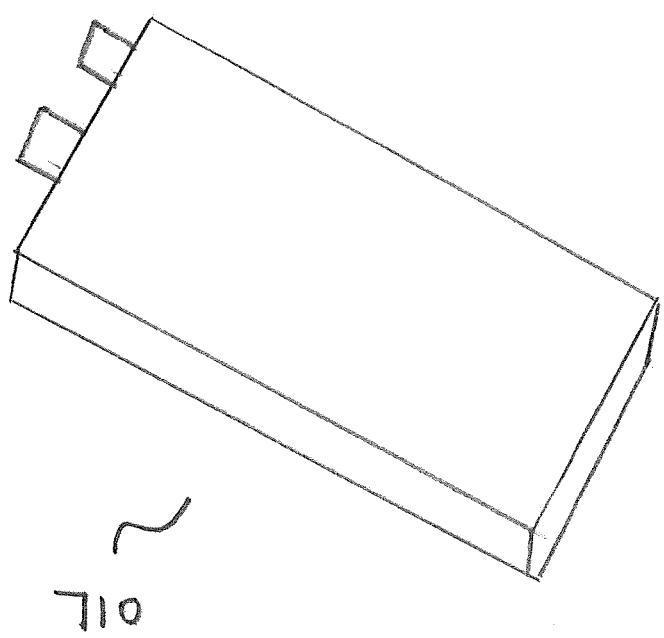
FIG. 7 illustrates a diagram of an exemplary embodiment of a pouch cell depicting disk drive dimensions.

FIG. 7 illustrates an exemplary embodiment of a pouch cell 710. In one exemplary embodiment, the electrolyte always exists in liquid form, but for "lithium polymer" cells, the electrolyte is absorbed in a polymer membrane. In one exemplary embodiment, this allows for cell manufacturers to use a pouch enclosure on the cell rather than the metal casing used when liquid electrolyte is present in cylindrical and prismatic shaped cells.

Figure 8:
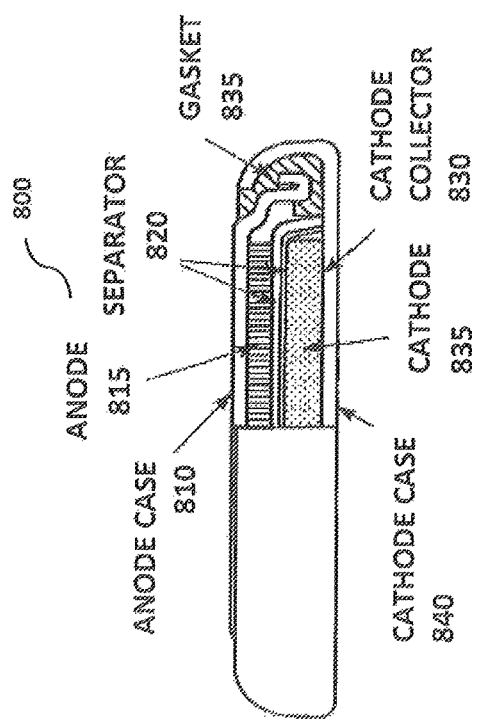
FIG. 8 illustrates a diagram of an exemplary embodiment of the present invention depicting a cross section of a coin or button cell.

FIG. 8 illustrates a diagram of an exemplary embodiment of the present invention depicting a cross section of a coin or button cell 800. In one exemplary embodiment, button cell 800 comprises of an anode case 810. In one exemplary embodiment, button cell 800 comprises of an anode 815. In one exemplary embodiment, button cell 800 comprises of a separator 820. in one exemplary embodiment, button cell 800 comprises of a gasket 825. In one exemplary embodiment, button cell 800 comprises of a cathode collector 830. In one exemplary embodiment, button cell 800 comprises of a cathode 835. In one exemplary embodiment, button cell 800 comprises of a cathode case 840.

Applications of the present invention are not limited in any way to SSDs. For example, an exemplary power source is also a structural component on any electronic device that requires a power source and at least one structural component.

The present invention is not limited to the embodiments described above but the constituent elements of the invention can be modified in various manners without departing from the spirit and scope of the invention. Various aspects of the invention can also be extracted from any appropriate combination of a plurality of constituent elements disclosed in the embodiments. Some constituent elements may be deleted in all of the constituent elements disclosed in the embodiments. The constituent elements described in different embodiments may be combined arbitrarily.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions.

As used in this specification and claims, the terms "for example," "for instance," "such as," and "like," and the verbs "comprising," "having," "including," and their other verb forms, when used in conjunction with a listing of one or more components or other items, are each to be construed as open-ended, meaning that that the listing is not to be considered as excluding other, additional components or items. Other terms are to be construed using their broadest reasonable meaning unless they are used in a context that requires a different interpretation.

The invention claimed is:

1. A module comprising:
a printed circuit board coupled to an external wall surface, said external wall surface having at least one PCB interface connector; and
a SSD case with at least one structural component that is removably coupled to the printed circuit board, whereby the at least one structural component is a power source, whereby the at least one structural component is a wall of the SSD case, and wherein said power source is completely contained inside said SSD case, and wherein said SSD case has a cell connector and a locking mechanism, and wherein said cell connector and said locking mechanism engages with said at least one PCB interface connector.

2. The module of claim 1, whereby the module is a SSD module.

3. The module of claim 1, whereby the at least one structural component contains at least one charging component.

4. The module of claim 1, whereby the at least one structural component contains at least one discharging component.

5. The module of claim 1, whereby the at least one structural component contains at least one safety circuit component.

6. The module of claim 1, whereby the power source is a pouch cell.

7. The module of claim 1, whereby the power source is a sealed cell.

8. The module of claim 1, wherein the at least one structural component provides an external surface for airflow cooling.

9. The module of claim 1, whereby the at least one surface of the power source is an external surface of the SSD case.

10. The module of claim 1 wherein said SSD case further comprises a pressure vent.

11. A method of providing power to a module, comprising the steps of:
providing a printed circuit board coupled to an external wall surface, said external wall surface having at least one PCB interface connector; and
removably connecting a SSD case with at least one structural component to the printed circuit board, whereby the at least one structural component is a power source, whereby the at least one structural component is a wall of the SSD case, and wherein said power source is completely contained inside said SSD case, and wherein said SSD case has a cell connector and a locking mechanism, and wherein said cell connector and said locking mechanism engage with said at least one PCB interface connector.

12. The method of claim 11, further comprising the step of providing a module that is a SSD module.

13. The method of claim 11, further comprising the step of coupling at least one charging component to the at least one structural component.

14. The method of claim 11, further comprising the step of coupling at least one discharging component to the at least one structural component.

15. The method of claim 11, further comprising the step of coupling at least one safety circuit component to the at least one structural component.

16. The method of claim 11, further comprising the step of using a pouch cell as the power source.

17. The method of claim 11, further comprising the step of using a sealed cell as the power source.

18. The method of claim 11, further comprising the step of using the at least one structural component on at least one external surface for airflow cooling.

19. The method of claim 11, further comprising the step of using the at least one surface of the power source as an external surface of the SSD case.

20. The method of claim 11, further comprising the step of said SSD case further comprising a pressure vent.

* * * * *